United States Patent [19]
Bauco et al.

[11] Patent Number: 5,387,797
[45] Date of Patent: Feb. 7, 1995

[54] DETECTOR HAVING SELECTIVE PHOTON AND NEUTRAL PARTICLE ABSORBENT COATING

[75] Inventors: Anthony S. Bauco, Vernon, Conn.; John W. Gray, Ware, Mass.

[73] Assignee: Galileo Electro-Optics Corporation, Sturbridge, Mass.

[21] Appl. No.: 172,710

[22] Filed: Dec. 27, 1993

[51] Int. Cl.⁶ .............................................. H01J 39/44
[52] U.S. Cl. ...................................... 250/397; 250/300
[58] Field of Search ............... 250/397, 299, 300, 283; 313/103 CM, 105 CM

[56] References Cited

U.S. PATENT DOCUMENTS

| | | | |
|---|---|---|---|
| 4,227,087 | 10/1980 | Kurz | 250/397 |
| 4,423,324 | 12/1983 | Stafford | 250/300 |
| 5,039,851 | 8/1991 | Green et al. | 250/207 |

*Primary Examiner*—Paul M. Dzierzynski
*Assistant Examiner*—Kiet T. Nguyen
*Attorney, Agent, or Firm*—Watson, Cole, Grindle & Watson

[57] ABSTRACT

A low noise ion detector has reflective parts coated for absorbing stray photon and neutral particles.

11 Claims, 3 Drawing Sheets

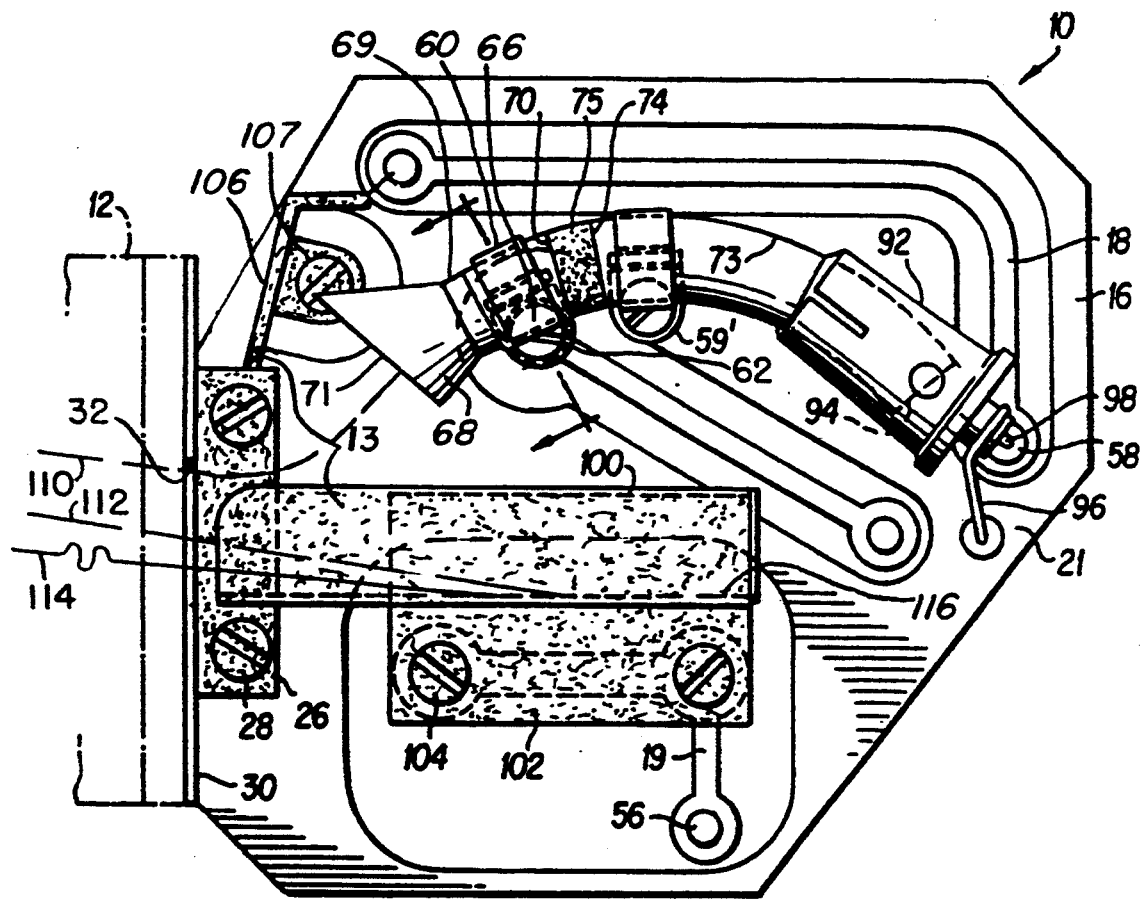
FIG. 2
FIG. 5
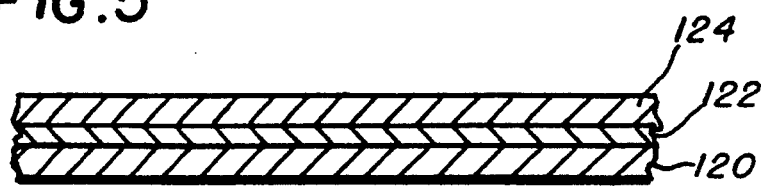

DETECTOR HAVING SELECTIVE PHOTON AND NEUTRAL PARTICLE ABSORBENT COATING

BACKGROUND OF THE INVENTION

The invention relates to high sensitivity low noise ion detectors for mass spectrometry. In particular, the invention relates to an ion detector having a selective coating for absorbing photon and neutral particles.

Electron multipliers are used in a mass spectrometer to detect the signal, in the form of a beam of positive or negative ions, exiting a mass filter. It is known that light photons, especially those in the ultraviolet region of the electromagnetic spectrum, and neutral particles are primary sources of noise. The electron multiplier amplifies the incoming signal and, in addition, amplifies noise components.

A complete detector assembly usually consists of an electron multiplier and metal hardware to which electrostatic potentials are applied for the purpose of steering and focusing the ion beam. The Noise Figure (NF) of a detector is defined as follows:

$$NF = \frac{S_{in}/N_{in}}{S_{out}/N_{out}}$$

Where:
$S_{in}$=Signal In
$S_{out}$=Signal Out
$N_{in}$=Noise In
$N_{out}$=Noise Out. The Noise Figure can be improved by reducing the noise or increasing the signal that reaches the electron multiplier.

SUMMARY OF THE INVENTION

The present invention is based upon the discovery that the amount of noise in that reaches the detector may be reduced by means of a selective coating for absorbing photons and neutral particles.

In a particular embodiment, wherein the detector employs an electron multiplier, a coating is applied to metallic surfaces near the input of the electron multiplier to absorb incoming photons and neutral particles. Optical or light signals may be absorbed by means of an optical black matte coating. Both photons and neutral particles may be absorbed by means of a precious metal catalyst, such as platinum black. These materials are capable of absorbing photons and neutral particles that strike reflective surfaces near the input of the electron multiplier in a high vacuum environment, for example, $10^{-4}$ torr or better.

Critical surfaces to be coated are those metal hardware components upon which the photons or neutral particles will most likely strike on their first or second bounce prior to entering the input end or cone of the electron multiplier. For example, stainless steel hardware can be coated with a precious metal catalyst, such as platinum, by first electroplating a thin layer of the precious metal by an electroplating process, followed by an immersion in a homogeneous bath of the precious metal, such as dihydrogen hexachloroplatinum acid and deionized water.

In a particular exemplary embodiment, the invention is directed to a modular plug-in electron multiplier for an analytical instrument, which comprises a circuit board formed with a ground plane having an end portion, a conductive end support attached to the end portion of the circuit board in contact with the ground plane. A channel electron multiplier having an input end is mounted on the circuit board by means of supporting hardware and an absorptive coating is disposed on metallic surfaces within any direct and reflected flight path of photons and neutral particles which may enter the input of the electron multiplier.

BRIEF DESCRIPTION OF THE DRAWINGS

FIG. 2 is a plan view of the detector assembly of the present invention located in an analytical instrument, portions of which are shown in phantom lines;

FIG. 5 is a fragmentary cross-sectional view of the selective coating deposited on a metal surface.

DESCRIPTION OF THE INVENTION

Figure 1:
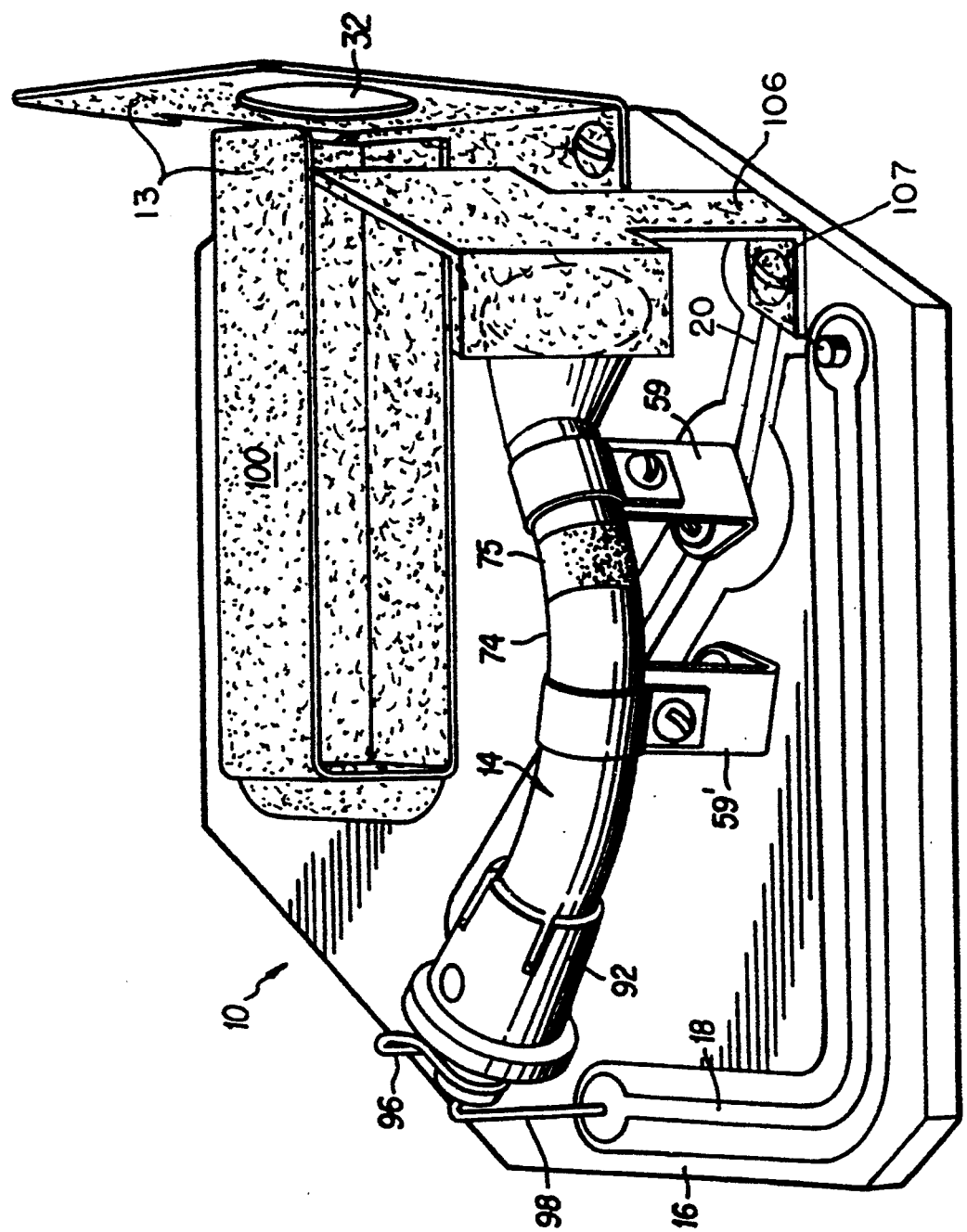
FIG. 1 is perspective view of an exemplary embodiment of a detector assembly according to the present invention.
Figure 3:
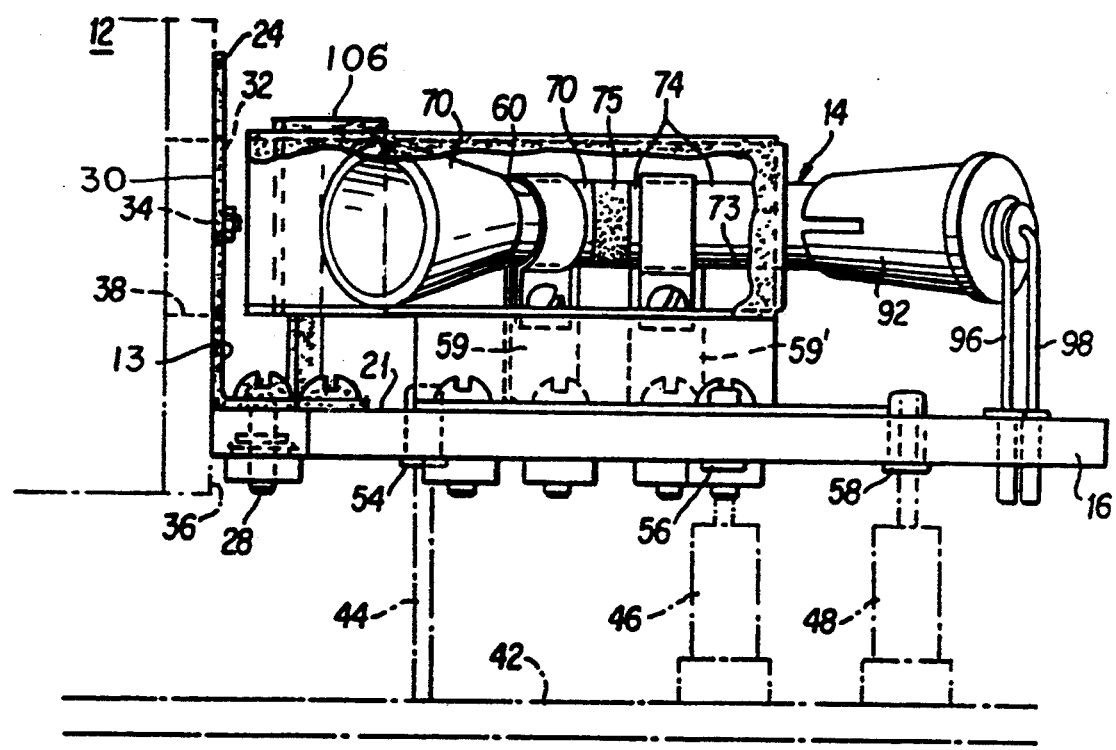
FIGS. 3 and 4 are respective side and end views of the detector assembly illustrated in FIG. 2.
Figure 4:
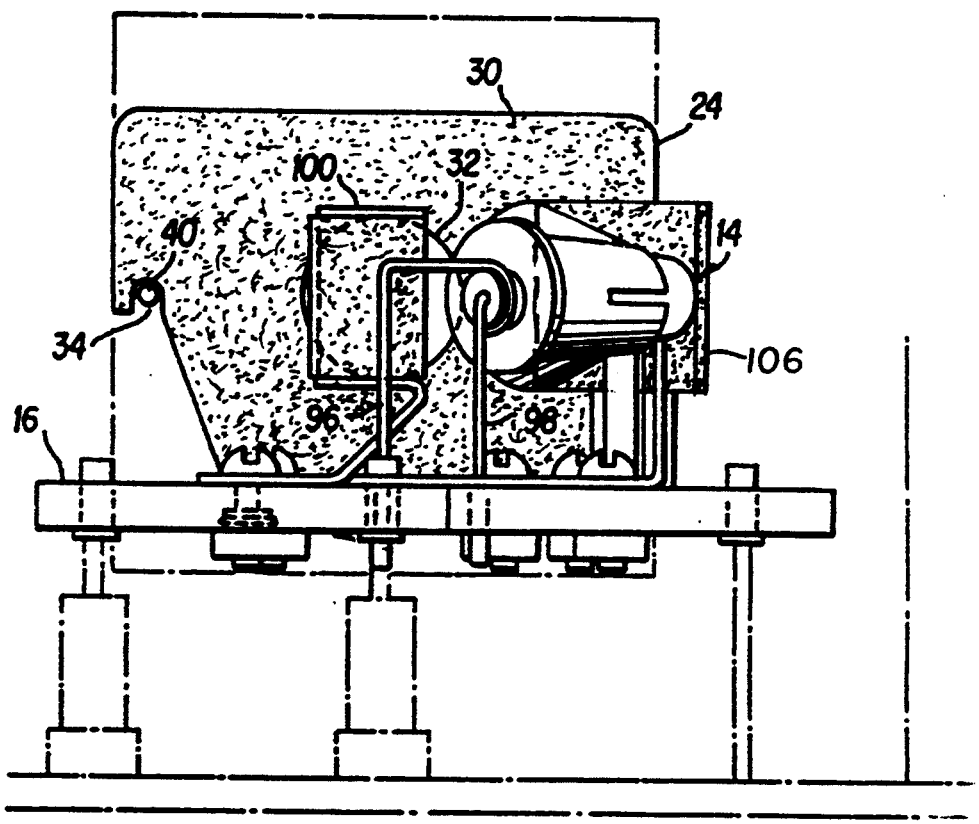

A channel electron multiplier (CEM) detector 10 for use with an analytical instrument, such as a mass spectrometer 12 is illustrated in FIGS. 1-5. The detector 10 according to the invention employs a selective coating 13 deposited onto various hardware surfaces of the detector for absorbing photon and neutral particles to suppress input noise, i.e., Noise In.

Although a CEM is illustrated, the present invention may be adapted for use with a variety of single and multichannel electron multipliers and a variety of detector arrangements. The particular arrangement shown herein, is exemplary of a device for use with the mass spectrometer 12 having desirable noise characteristics. Such a device is more fully described in U.S. Pat. No. 5,039,851, assigned to the assignee herein, the teachings of which are incorporated herein by reference. The particular detector 10 reduces the labor required for assembly and, at the same time, results in a much more rigid structure with lower susceptibility to microphonics noise.

The exemplary detector 10 comprises a channel electron multiplier 14 mounted to a vacuum compatible circuit board 16. Printed circuit track 18, formed on the board 16, carries signal, and tracks 19 and 20 carry a voltage sufficient for ion deflection, ion steering and electron multiplication. Remaining portions of the board 16 carry a printed ground plane 21.

In accordance with the invention, the selective coating 13 is deposited on those surfaces within the detector 10 which are capable of reflecting photon or neutral particles. However, before describing the coating and the process forming the same, the various components of the exemplary detector 10 will be described below.

A conductive end support member 24 is secured at one end 26 to the circuit board 16 in electrical contact with the ground plane 21 by means of an appropriate fastener 28. An upstanding wall portion 30 having an aperture 32 and support slots 34 therein abuts the end 36 of the instrument 12 as shown. An aperture 38 in the instrument wall 36 is aligned with the aperture 32 in the wall portion 30. Threaded support studs 40 extend from the wall 36 and are aligned with slots 34 in the wall portion 30. Hand tightenable fasteners 42 are threaded onto the studs 40 for securing the input end of the detector 10 against the wall 36 of the instrument 12 in a vertical plane as shown. The ground plane 21 is grounded to the instrument 12 by means of the end support 24.

The instrument 12 has a number of flying leads 44, 46 and 48 which are located in preselected fixed positions therein. The flying leads are adapted to registerably engage mating receptacles or pin Jack connectors 54, 56 and 58 mounted in the circuit board 16. The flying leads 44–48 frictionally engage the pin jacks 54–58 and support the circuit board 16 in a horizontal plane transverse to the vertical plane of the wall 36, such that the detector 10 is rigidly supported and restrained against vibration.

Conductive supports 59–59' secure the electron multiplier 14 to the circuit board 16 in spaced relationship with the plane of the circuit board 16 and aligned with the aperture 38 in the instrument 12. The conductive supports 59–59' include a cylindrical clip or collar 60 which circumferentially engages the electron multiplier 14. The collar 60 has apertured tabs 62. An L-shaped bracket 64 having an apertured free end 65 is secured thereat to the tabs 62 by means of a fastener 66. In the arrangement illustrated, one of the supports 59 is secured to the channel electron multiplier 14 near the cone portion 68 and adjacent neck portion 69 as illustrated. These areas are plated with a conductive input electrode coating 70 and carry high voltage for biasing the CEM at its input end 71 so that electron multiplication may be initiated. The L-shaped bracket 64 is secured to the circuit board 16 in contact with the high voltage track 20. The other support 59' formed of the same components is secured to the channel electron multiplier 14 in the curved region 73. An output electrode 74 in contact with the fastener 72 is formed as a conductive coating on the CEM 14 in this region and extends to the output end 75. The input and output electrodes 70–74 are separated by a non-conductive region 75. The support 59' secures the CEM to the circuit board 16 and electrically couples the output electrode 74 to the ground plane 21. A collector electrode 92 is secured to the output end 94 of the multiplier 14. A ground wired 96 is coupled to the output electrode 92 and to the ground plane 21. The signal wire 98 is coupled to the signal track 18.

Ion deflector 100 is located adjacent the output 38 of the instrument 12. The deflector 100 is secured to the circuit board 16 by means of a bracket 102 and fasteners 104 which pass through the openings therein. Track 19 is located on the circuit board 16 immediately below the bracket 102 and makes contact therewith. A voltage provided by the lead 46 and coupled to pin jack 56 at the end of the track 19 thus maintains the ion deflector 100 at a selected voltage level.

Steering electrode 106 is mounted to the circuit board 16 adjacent the input cone 71 by means of fasteners 107. The steering electrode produces an auxiliary deflecting field to steer ions into the CEM 14. The steering electrode 106 is electrically connected to the high voltage track 20 in common with the plated cone electrode 70.

In accordance with the invention, surfaces of various hardware elements are coated with the selectively absorbent coating 13, in order the reduce the possibility that photon and neutral particles will enter the input end or cone 71 of the electron multiplier 14. In particular, the apertured plate 24, the ion deflector 100, bracket 102 and the steering electrode 106 are selectively coated.

FIG. 2 illustrates by dotted lines, the path of an ion 110, a neutral particle 112, and a photon 114. In accordance with normal practice, the ions 110 enter the detector 10 through the aperture 32 in the upstanding wall portion 30 which itself acts as a mass filter for stray particles. The ions 110 are deflected by the high voltage carried commonly by the steering electrode 106 and the ion deflector 100, causing the ions to enter the cone or input end 71 of the electron multiplier.

Neutral particles 112 enter the detector 10 through the aperture 32, but are unaffected by the electric field and strike the interior surface 116 of the ion deflector 100. It is possible, however, that the neutral particles 112 can be sufficiently energetic to cause secondary emission from the ion deflector 100 or quite possibly, be reflected off the internal surfaces of the metal parts and be captured in the input cone 71 of the electron multiplier 14 causing a spurious input signal.

Likewise, photons 114 may enter the detector 10 through the aperture 32 and strike various internal surfaces, such as the interior surface 116 of the detector, thereby being reflected into the input cone 71 and also causing a spurious signal.

In order to prevent such false signals which contribute to input noise, the various metallic or reflective surfaces of the detector 10 receive the selective coating 13. As best illustrated in FIG. 5, an exemplary metallic surface 120 may receive the selective coating 13 in the form of a first layer 122 of, for example, a precious catalytic metal, such as platinum black, by an electroplating process. Alternatively, the first layer 122 may be a base metal, such as Nickel (Ni). Thereafter, an overlayer 124 of, for example, catalytic platinum may be deposited by immersion in a bath of dihydrogen hexachloroplatinum acid and deionized water. The overlayer 124 is effective for absorbing neutral particles and energetic photons in the ultraviolet region.

In accordance with the invention, the coated surface 120 may include any metallic or reflective surface, which could be located in a direct or indirect path to the input 71 of the electron multiplier 14. In theory, only those portions that are near the input 71 would be coated. As a practical matter, however, it is expedient to simply coat as many of the surfaces as would likely reflect neutral particles or energetic photons. In the present invention, the surfaces of the upstanding wall portion 30, the ion deflector 100, the hardware, for example, screws 28, and quite possibly the ground plane may receive the selective coating.

Suitable materials for coating the various metallic parts include, for example, chrome oxide, nickel oxide, which are effective to absorb photons. Platinum black coatings are effective to absorb photons and neutral particles. Homogeneous catalysts such as those sold by Johnson Matthey of Seabrook, N.H., for example, crystalline 99.9%, $H_2PtCl_6.6H_2O$ (40% Pt) in deionized water is an effective solution for producing the catalytic overlayer 124 (Fig. 5). The electroplated layer 122 may be produced by known methods. The overall thickness of the electroplated layer should be sufficient to support the overlayer 124. The thickness of the overlayer 124 should be sufficient to result in an optical matte or non-reflective finish, capable of absorbing photons and neutral particles. Other suitable materials include homogeneous precious metal catalysts in the platinum group sold by Johnson Matthey, for example, Rhodium (III) Chloride $RhCl_3.XH_2O$ (42.5%) or Ruthenium (III) Chloride $RuCl_3.3\ H_2O$ (42% Ru).

While there have been described what are at present considered to be the preferred embodiments of the present invention, it will be apparent to those skilled in the art that various changes and modifications may be made there in without departing from the invention, and it is intended in the appended claims to cover such changes and modifications as fall within the spirit and scope of the invention.

What is claimed is:

1. An ion detector for reducing input noise sources caused by stray photons and neutral particles comprising:
   an electron multiplier having an input end;
   electrode means for directing ions into the electron multiplier; and
   a selective coating on portions of the electrode means for absorbing the photons and neutral particles impinging thereon.

2. The ion detector of claim 1 wherein the electron multiplier has its input end located in a region of space within which said noise sources may exist and the coating is disposed on at least those portions of the electrode means within the said region of space.

3. A modular ion detector for reducing noise caused by photons and neutral particles in a measuring instrument having an input end, mechanical supports and electrical leads in a predefined spaced relationship comprising:
   a channel electron multiplier (CEM) having an input end;
   a circuit board;
   mounting means for securing the CEM to the circuit board with an input of the mounting means being registerable with the input of the measuring instrument;
   printed circuit tracks on the circuit board for attachment to the mounting means at one end and extending at the other end to locations registerable with the electrical leads of the instrument;
   receptacle means on the circuit board at said other ends of the electrical tracks for registerably engaging the electrical leads of the instrument and supporting the detector in a plane;
   electrode means coupled to the tracks for directing ions into the CEM;
   at least one mechanical support means secured to the circuit board for registerably engaging the mechanical support of the instrument; and
   a selective coating disposed on portions of the electrode means adjacent the input end of the electron multiplier for absorbing the photon and neutral particles.

4. The modular ion detector according to claim 3 wherein the selective coating comprises an optical matte coating.

5. The modular ion detector of claim 3 wherein the selective coating comprises a precious metal catalytic coating.

6. The modular ion detector of claim 5 wherein the catalytic coating comprises platinum black.

7. The modular ion detector according to claim 3 wherein the mechanical support is disposed in a plane transverse to the first mentioned plane to thereby rigidly support the modular ion detector in the instrument for reducing microphonics.

8. The modular ion detector according to claim 3 wherein the circuit board comprises a ground plane surrounding the tracks and being in electrical contact with the mounting means for providing a common electrical connection with the instrument and the CEM.

9. The modular ion detector according to claim 3 wherein the electrode means comprises ion deflector means mounted adjacent the input end of the CEM and being electrically connected to a track for maintaining a potential for deflecting ions produced in the detector, said selective coating being deposited on portions of the ion deflector adjacent the input end of the CEM.

10. The modular ion detector of claim 3 wherein the electrode means comprises steering electrode means mounted adjacent the input ends of the CEM and being maintained in common electrical connection with the input of the CEM.

11. The modular ion detector according to claim 3 wherein the noise associated with the photons and neutral particles is reduced.

* * * * *